(12) United States Patent
Weir (10) Patent No.: US 8,273,979 B2
(45) Date of Patent: Sep. 25, 2012

(54) TIME AVERAGED MODULATED DIODE APPARATUS FOR PHOTOVOLTAIC APPLICATION

(75) Inventor: Steven P. Weir, Petaluma, CA (US)

(73) Assignee: Xandex, Inc., Petaluma, CA (US)

( * ) Notice: Subject to any disclaimer, the term of this patent is extended or adjusted under 35 U.S.C. 154(b) by 381 days.

(21) Appl. No.: 12/434,391

(22) Filed: May 1, 2009

(65) Prior Publication Data

US 2010/0089431 A1 Apr. 15, 2010

Related U.S. Application Data

(60) Provisional application No. 61/105,575, filed on Oct. 15, 2008.

(51) Int. Cl.
*H01L 31/042* (2006.01)
*H02J 1/12* (2006.01)
*G05F 1/00* (2006.01)
*H02J 1/00* (2006.01)
*G05F 3/16* (2006.01)

(52) U.S. Cl. ........ 136/244; 323/222; 323/223; 323/271; 323/282; 323/299; 323/304; 307/45; 307/71; 307/80; 307/85

(58) Field of Classification Search ................. 323/222, 323/223, 232, 271, 282, 304, 299; 307/45, 307/71, 80, 85
See application file for complete search history.

(56) References Cited

U.S. PATENT DOCUMENTS

| | | | |
|---|---|---|---|
| 4,847,546 A | 7/1989 | Bobier | |
| 5,270,636 A | 12/1993 | Lafferty | |
| 5,504,418 A | 4/1996 | Ashley | |
| 5,932,994 A | 8/1999 | Jo et al. | |
| 6,448,489 B2 | 9/2002 | Kimura et al. | |
| 6,744,236 B2 | 6/2004 | Capel et al. | |
| 7,495,419 B1 | 2/2009 | Ju | |
| 7,602,080 B1 | 10/2009 | Hadar et al. | |
| 2005/0172995 A1 | 8/2005 | Rohrig et al. | |
| 2006/0001406 A1 | 1/2006 | Matan | |
| 2006/0174939 A1 | 8/2006 | Matan | |
| 2006/0185727 A1 | 8/2006 | Matan | |
| 2007/0024257 A1 | 2/2007 | Boldo | |
| 2007/0186969 A1 | 8/2007 | Kohler et al. | |
| 2007/0235071 A1 | 10/2007 | Work et al. | |
| 2008/0097655 A1 | 4/2008 | Hadar et al. | |
| 2008/0105292 A1 | 5/2008 | Merz | |
| 2008/0111517 A1 | 5/2008 | Pfeifer et al. | |
| 2008/0121272 A1 | 5/2008 | Besser et al. | |
| 2008/0135084 A1 | 6/2008 | Scharlack | |

(Continued)

FOREIGN PATENT DOCUMENTS

JP 10-189934 7/1998

(Continued)

OTHER PUBLICATIONS

Twenty Ninety / Active Array™ Solar Panel Technology, http://www.twentyninety.com/active-array-technology.htm, 2 pages printed on Oct. 22, 2008.

(Continued)

*Primary Examiner* — Jennifer Michener
*Assistant Examiner* — Marla D McConnell
(74) *Attorney, Agent, or Firm* — Weaver Austin Villeneuve and Sampson LLP (57) ABSTRACT

DC-DC converters are described that employ a time-averaged modulated bypass diode to facilitate the efficient harvest of power in photovoltaic systems.

24 Claims, 11 Drawing Sheets

U.S. PATENT DOCUMENTS

| | | |
|---|---|---|
| 2008/0150366 A1 | 6/2008 | Adest et al. |
| 2008/0191675 A1 | 8/2008 | Besser et al. |
| 2008/0236648 A1 | 10/2008 | Klein et al. |
| 2008/0238195 A1 | 10/2008 | Shaver et al. |

FOREIGN PATENT DOCUMENTS

| | | |
|---|---|---|
| JP | 2005276942 A | 10/2005 |
| KR | 10-2005-0099975 | 10/2005 |
| KR | 1020070009497 | 1/2007 |
| WO | WO2005112551 | 12/2005 |
| WO | WO 2007-043532 | 4/2007 |
| WO | WO2007048421 | 5/2007 |

OTHER PUBLICATIONS

Clark, "Solar Industry Gets Aid to Fight Shade", National, Jun. 30, 2008, p. B6.

National Semiconductor, SolarMagic™ Technology—Maximizing Solar Panel Energy Efficiency, http://www.national.com/analog/solarmagic, 2 pages, printed on Oct. 22, 2008.

National Semiconductor, SolarMagic™Technology—Maximizing Solar Panel Energy Efficiency, http://www.national.com/analog/solarmagic, 4 pages, printed on Oct. 22, 2008.

Walker et al., "Cascaded DC-DC Converter Connection of Photovoltaic Modules", School of Information Technology and Electrical Engineering, University of Queensland, *IEEE*, pp. 24-29 (2002).

Sherman et al., EDN Access, "Synchronous Rectification: improving the efficiency of buck converter" Mar. 16, 1996, http://www.edn.com/archives/1996/031496/06df4.htm.

Pressman, Switching and Linear Power Supply, Power Convener Design, p. 6 & 8, Figs. 1-4, 1-5, Jan. 1, 1977.

International Search Report and Written Opinion dated May 6, 2010, PCT Application No. PCT/US2009/059634.

Esram, et al., "Dynamic Maximum Power Point Tracking of Photovoltaic arrays Using Ripple Correlation Control", *IEEE Transactions on Power Electronics*, vol. 21, No. 5, Sep. 2006.

Blue Sky Energy, "What is Maximum Power Point Tracking (MPPT) and How Does It Work", www.blueskyeneryinc.com, Richard A. Cullen, downloaded Feb. 14, 2012.

TIME AVERAGED MODULATED DIODE
APPARATUS FOR PHOTOVOLTAIC
APPLICATION

RELATED APPLICATION DATA

The present application claims priority under 35 U.S.C. 119(e) to U.S. Provisional Patent Application No. 61/105,575 for TIME AVERAGED MODULATED DIODE APPARATUS FOR PHOTOVOLTAIC APPLICATION filed Oct. 15, 2008, the entire disclosure of which is incorporated herein by reference for all purposes.

BACKGROUND OF THE INVENTION

The present invention relates to power recovery from arrays of photovoltaic cells.

Figure 1:
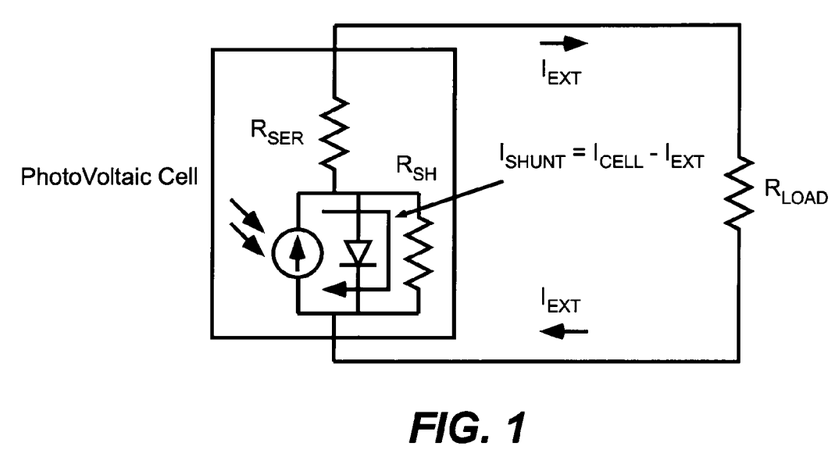
FIG. 1 illustrates a single PV cell with an external load.
Figure 2:
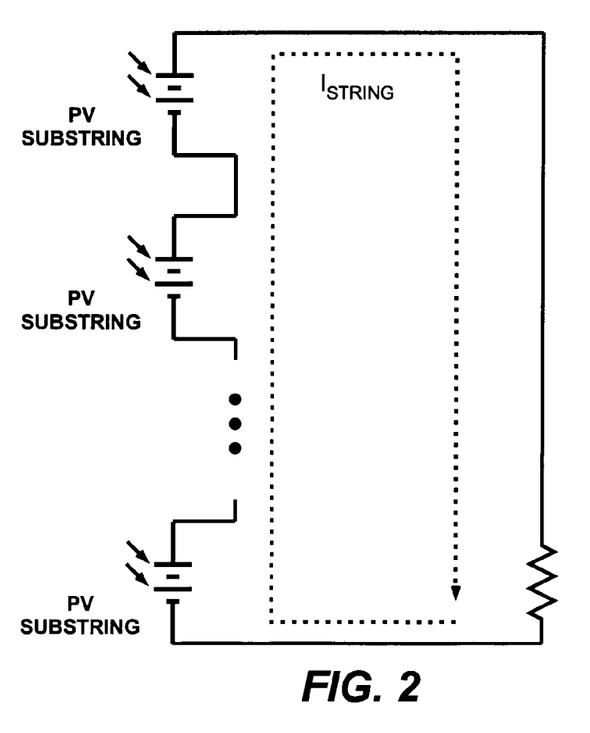
FIG. 2 illustrates a string of PV cells.

Photovoltaic (PV) cells have existed for many years and are well described within the art. Summary features of a PV cell are a device that includes a barrier semiconductor junction capable of converting energy from impinging photons into a current dispensed into an external load (see FIG. 1). In photovoltaic power systems it is common practice to wire cells in series strings (see FIG. 2). Series connection minimizes wire power loss by maximizing voltage and minimizing current. Under ideal conditions the photocurrent in each cell closely matches. Under real operating conditions photocurrent may vary greatly between individual cells, or groups of cells. Because all cells are in series, the entire string current is then limited to the cell with the lowest photocurrent.

Figure 3:
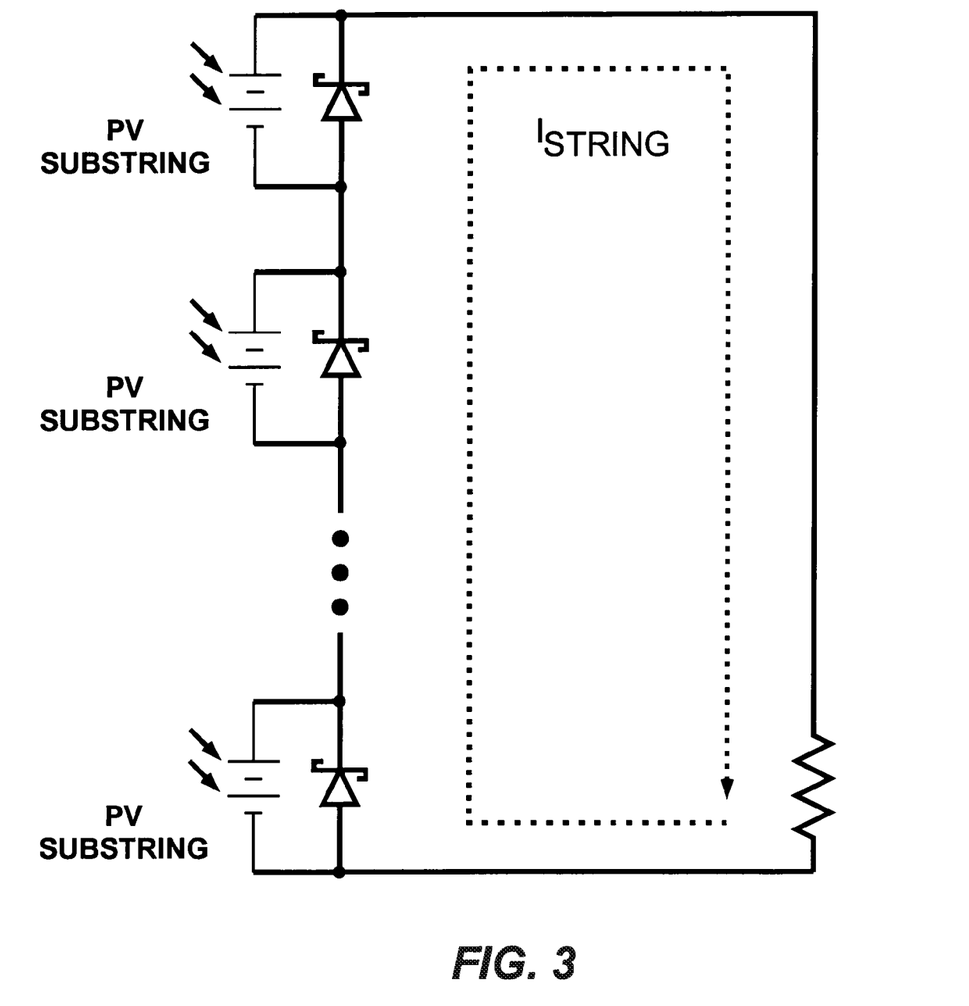
FIG. 3 illustrates PV substrings with bypass diodes.

In order to address this problem, PV strings are commonly divided into substrings, where a bypass diode connects across each substring (see FIG. 3). A substring may consist of a single photovoltaic panel or more typically a cell column or cell column pair within a photovoltaic panel. When photocurrent in one substring falls significantly below string current, the associated bypass diode forward biases, shunting string current around the associated substring. While this preserves the bulk of string current, it results in a total loss of available power from the affected substring as well as loss from the forward voltage drop of the bypass diode.

Figure 4:
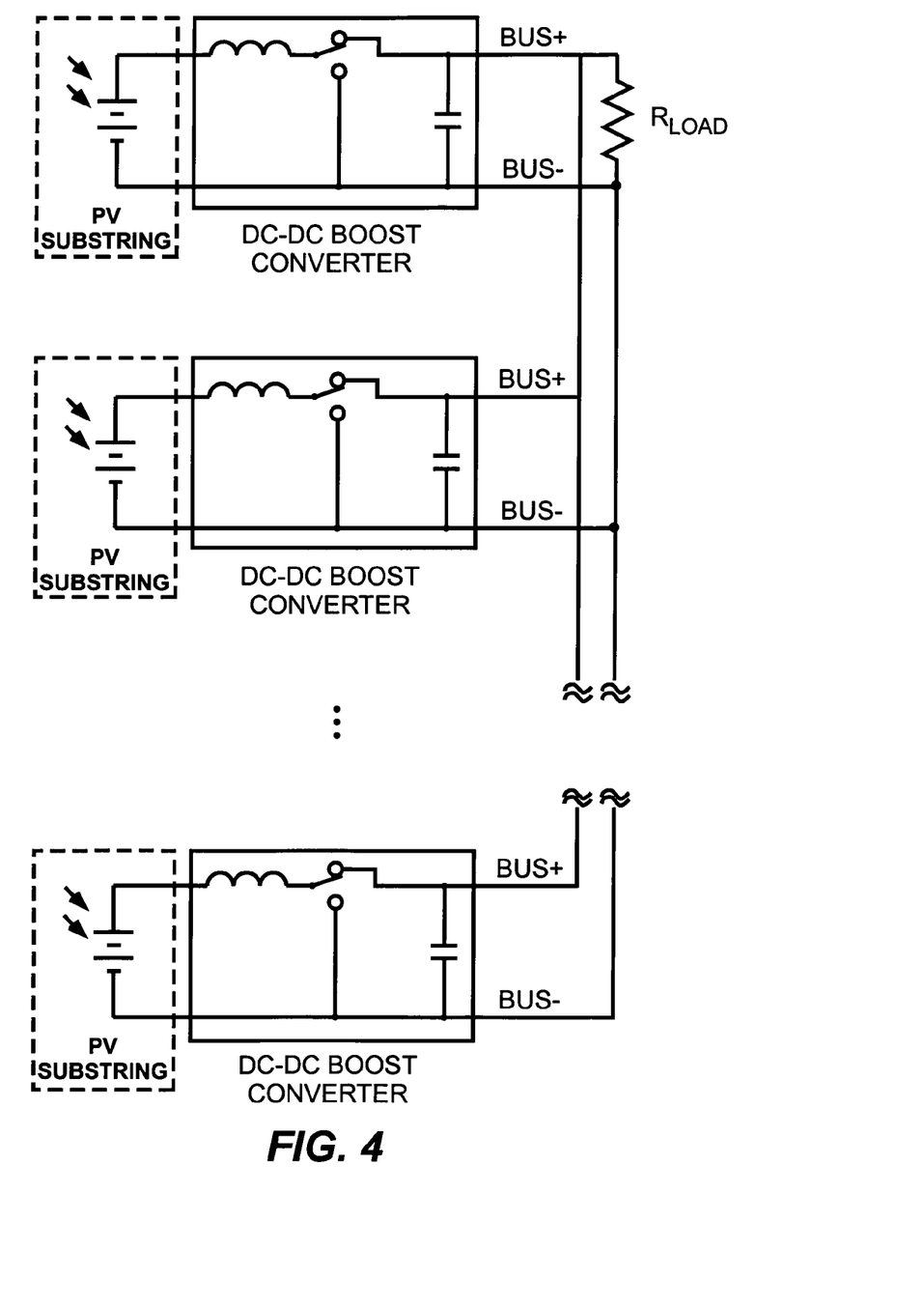
FIG. 4 illustrates PV substrings with dedicated DC-DC boost converters.
Figure 5:
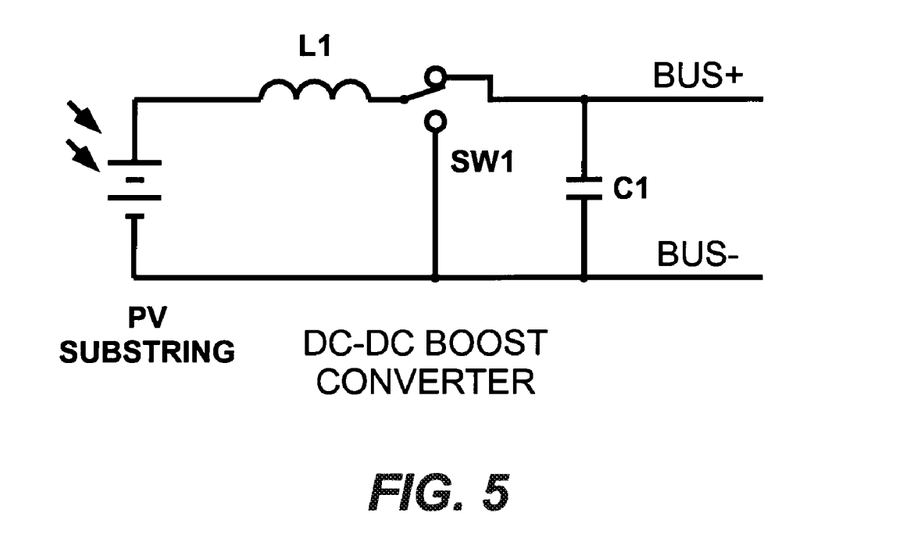
FIG. 5 illustrates a PV substring with a DC voltage boost converter.
Figure 6:
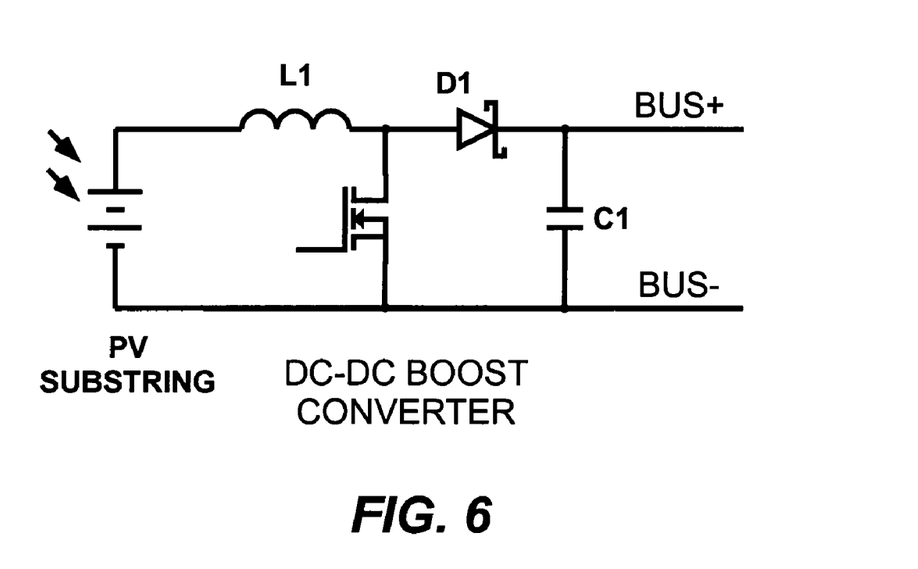
FIG. 6 illustrates a boost converter employing a MOSFET and a diode switch.

An alternative to the use of simple passive diodes connects each substring to an independent DC voltage boost converter attached to a common parallel DC bus (see FIG. 4). DC voltage boost converters harvest PV substring power by presenting one impedance to each substring, and a different impedance to the load. A boost converter (see FIG. 5) operates by periodically toggling SPDT switch SW1 between the BUS− and BUS+ connections. SW1 connected to BUS− builds current in L1. SW1 connected to BUS+ discharges L1 current into C1. Typically, SW1 may be constructed using an active switching device such as a MOSFET transistor between L1 and BUS− and a Schottky diode, between L1 and BUS+ (see FIG. 6). In such implementations, D1 also protects against reverse current flow from BUS+ through the PV substring to BUS−.

For L1 sufficiently large to support continuous conduction across each switching cycle, and assuming zero losses, average current delivered to the bus is:

$$I_{BUS\_AVERAGE}/I_{PV\_AVERAGE}=(T_{PERIOD}-T_{ON})/T_{PERIOD}$$

Control electronics may vary $T_{PERIOD}$, $T_{ON}$, or both so as to set average PV current, $I_{PV\_AVERAGE}$, at the maximum load power point for the attached PV substring. The control may find the maximum power point by varying ratios of $T_{ON}$ to $T_{PERIOD}$ while measuring PV substring terminal voltage and current until a maximum is found.

Disadvantages of boost converters tied to a common parallel bus include: the voltage drop through diode D1; low bus voltage and impedance results in high wiring current and associated power losses; cumulative wiring distribution losses of a parallel network; and catastrophic failure of the network when one element fails short. The percentage power loss through diode D1, and external wiring may be reduced by transforming the output voltage by common means, e.g., a flyback topology, or the addition of a second power conversion stage, each of which adds complexity.

Figure 7:
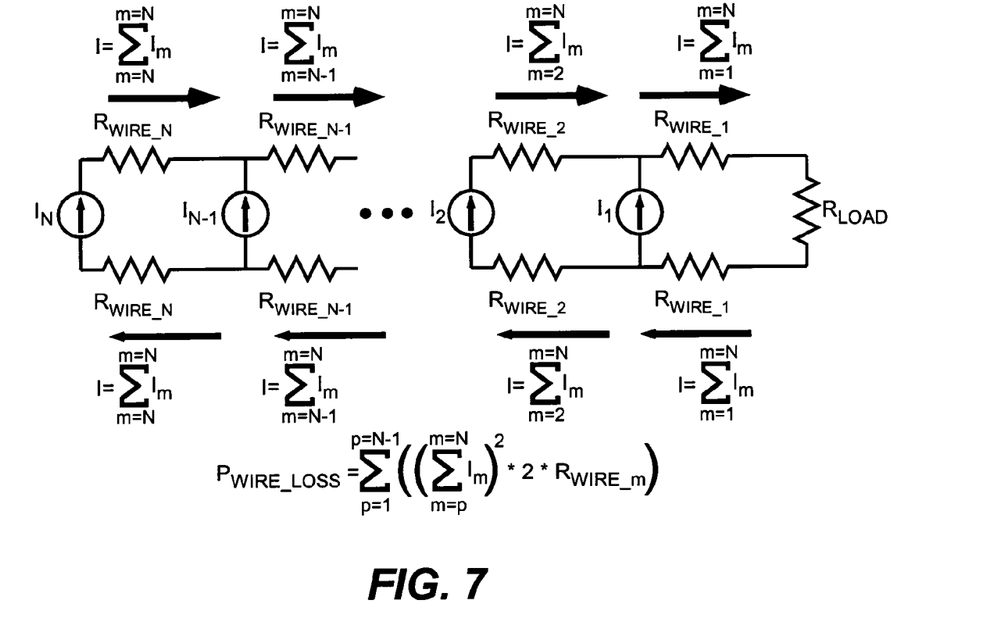
FIG. 7 is an illustration of parallel wiring losses.
Figure 8:
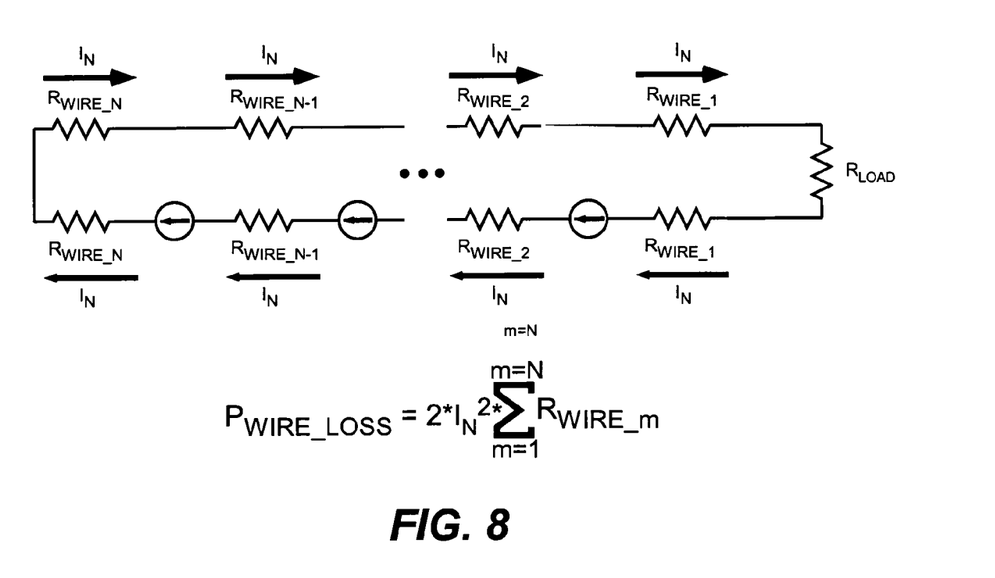
FIG. 8 is an illustration of series wiring losses.

In a parallel wiring scheme, loop current builds with each successive segment approaching the load. For equal length and diameter wires in each segment and equal currents from each source, the power losses in each wiring segment build up quadratically (see FIG. 7). Given ten sources, the wire segment from the furthest to second furthest source loads with $1/10^{th}$ the current and $1/100^{th}$ the power loss of the nearest source to the load. In order to avoid excessive power loss and fire hazards, wiring cross-section must either scale from the furthest to closest source, or wire must be over-provisioned for all sources other than the closest. By comparison, current through a series wiring scheme is constant in each segment. Wiring losses per unit length are therefore also constant allowing safe use of a constant cross-section without over-provisioning (see FIG. 8).

Figure 9:
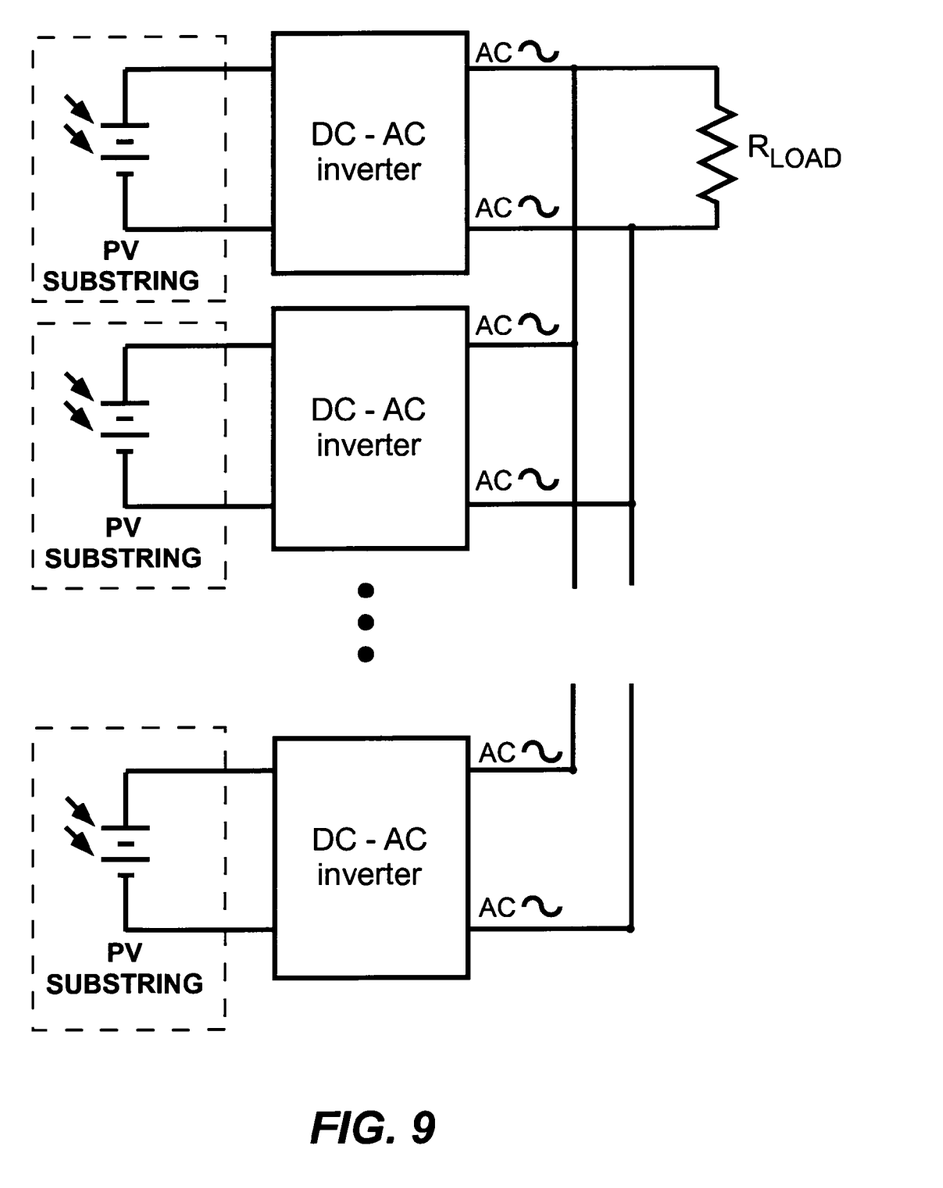
FIG. 9 illustrates PV substrings with dedicated DC-AC inverters.

Prior solutions include the use of AC inverters in place of simple DC voltage boost converters (see FIG. 9). PV AC-inverter-per-substring schemes mitigate some of the wiring loss issues by operating at a higher voltage/lower current than typical DC voltage boost; most commonly at an AC main value of 105-220 VAC. However, the wiring mechanics, heating, and power loss problems remain the same as for the DC case.

AC single and/or split phase inverters at each substring suffer a further requirement for substantial energy storage. Over the course of a single half cycle load power varies from zero to maximum and back to zero while the PV source power is constant. In order to fully utilize PV source power, a minimum of 32% of the energy delivered in a single half cycle must be accumulated by an energy reservoir. For 60 Hz systems, the minimum energy store required to maintain constant load on the PV source is 2.7 mJ/Watt power input. This substantial energy storage is economically practical only using capacitors, typically of wet electrolytic construction.

Unfortunately, wet electrolytic capacitors exhibit high internal Effective Series Resistance (ESR) which causes internal heating. They also perform poorly in cold environments, exhibiting much higher impedances than at room temperature. They are also characterized by high failure rates and short expected lifetimes aggravated by exposure to moderate or high temperatures. The poor expected lifetime and environmental performance of wet electrolytic capacitors presents a serious problem when used in products such as outdoor PV equipment that is exposed to the elements, has a long expected service life, and a high cost to service due to limited accessibility.

Moreover, in order to protect utility service personnel, AC microinverters tied directly to the premise utility must include a critical safety feature wherein they halt power generation in event of utility failure. This function is known as anti-islanding. Deployment of many AC microinverters in place of a single centralized inverter multiplies the probability that the critical anti-islanding function will fail. A further drawback of both DC voltage boost and parallel AC microinverters is that an inverter is required on each substring, even if only a few substrings are likely to suffer from uneven illumination.

SUMMARY OF THE INVENTION

According to the present invention, techniques are described that facilitate the efficient harvest of power in photovoltaic systems. According to a particular class of embodiments, a photovoltaic (PV) system is provided that includes a plurality of PV modules connected in series. Selected ones of the PV modules have an associated energy storage circuit in parallel therewith, and a switched bypass current path in parallel with the associated energy storage circuit. The PV system further includes control circuitry configured to control the switched bypass current path associated with each selected PV module with reference to a local PV module current through the associated selected PV module, an aggregate system current through the switched bypass current path, and a local PV module voltage across the energy storage circuit, such that an averaged product of the local PV module current and the local PV module voltage for each selected PV module is maximized.

According to another class of embodiments, a DC-DC converter for use with a photovoltaic (PV) module is provided. The DC-DC converter includes an energy storage circuit configured for connection in parallel with the PV module, and a switched bypass current path in parallel with the energy storage circuit. The DC-DC converter further includes control circuitry configured to control the switched bypass current path with reference to a PV module current through the PV module, a bypass current through the switched bypass current path, and a PV module voltage across the energy storage circuit, such that an averaged product of the PV module current and the PV module voltage is maximized.

According to yet another class of embodiments, a DC-DC converter for use with a photovoltaic (PV) module is provided. The DC-DC converter has a Buck regulator topology including an energy storage circuit and a switch. The DC-DC converter further includes control circuitry configured to control the switch such that an average power delivered by the PV module to an output node of the energy storage circuit is maximized.

A further understanding of the nature and advantages of the present invention may be realized by reference to the remaining portions of the specification and the drawings.

DETAILED DESCRIPTION OF SPECIFIC EMBODIMENTS

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

Figure 10:
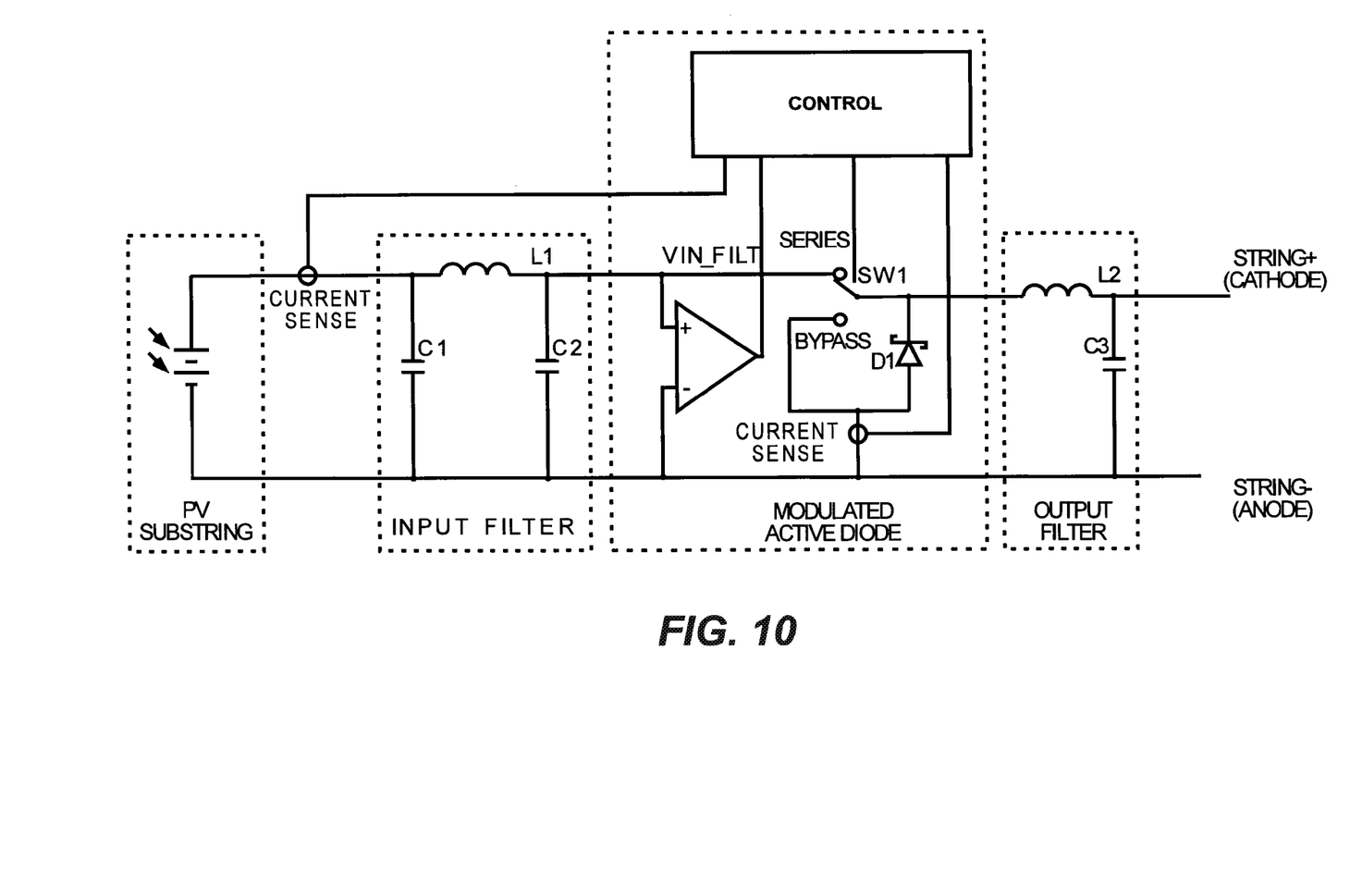
FIGS. 10-12 are simplified diagrams of a DC-DC converter implemented according to various embodiments of the invention.
Figure 11:
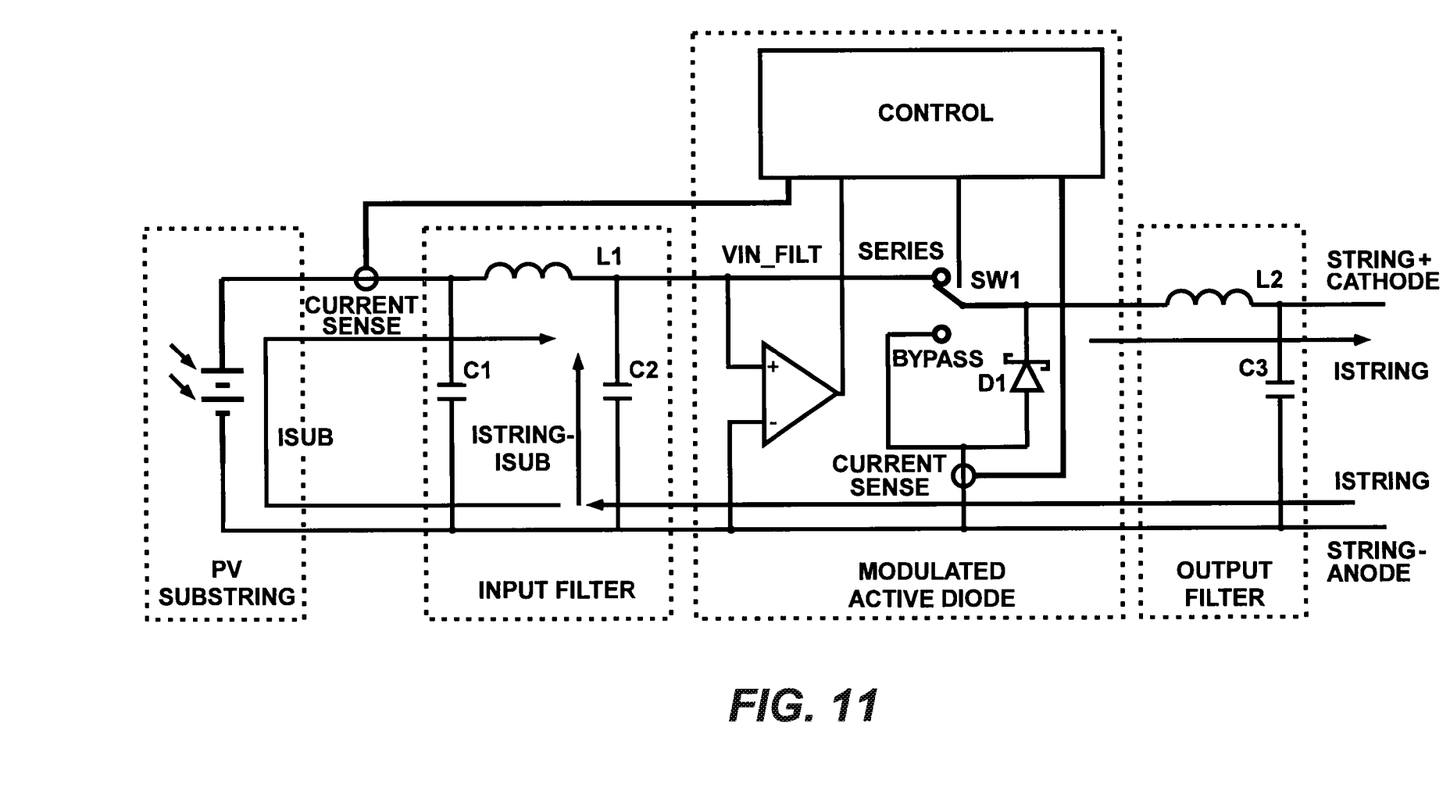
Figure 12:
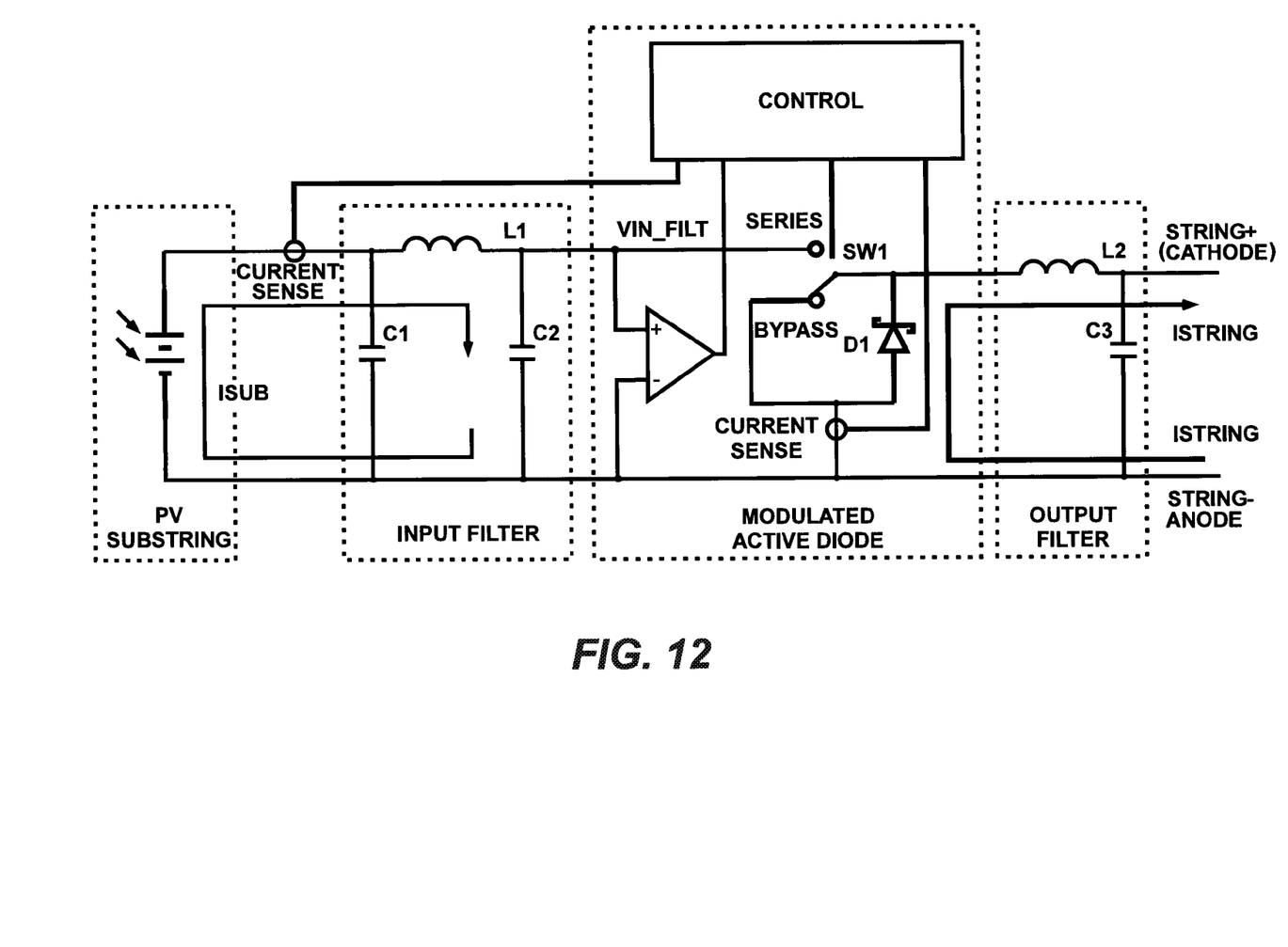

Embodiments of the present invention employ a time-averaged modulated bypass diode to facilitate the efficient harvest of power in photovoltaic systems. A DC-DC converter implemented in accordance with a particular embodiment of the invention may be understood with reference to FIGS. 10-12 which illustrate various states of operation of the depicted implementation. Like reference designations and labels common to each figure represent the same system components. As may be recognized, the topology shown in FIGS. 10-12 is similar to that of a Buck DC-DC converter with the addition of a C1-L1-C2 input filter. However, as will be described herein, the control operation of this implementation is quite different than conventional Buck DC-DC converters.

SW1 switches periodically at a rate substantially greater than the time constant of the input filter. When SW1 is in the Series position (see FIG. 11) any string current greater than the local PV substring current passes primarily through C2 and to a lesser extent through C1 and L1, reducing the voltage at the output node of the input filter, i.e., VIN_FILT. When SW1 is in the bypass position (see FIG. 12), the local PV substring recharges C1 and C2 through L1 while string current all flows through SW1. Under steady-state conditions, the voltage at VIN_FILT is a function of the local PV substring current (ISUB), the string current (ISTRING), and the relative times that SW1 is in the SERIES and BYPASS positions each cycle.

Under normal operating conditions, the control block senses the voltage VIN_FILT, the PV substring current, the bypass path current, and the voltage difference from STRING+ (cathode) to STRING− (anode). The control block modulates the timing of SW1 so as to maximize the averaged product of the PV substring current (ISUB) and VIN_FILT. That is, the control block controls operation of SW1 to maximize the average power at the output node of the input filter. According to a particular embodiment, the time each cycle that SW1 is in the BYPASS position is held substantially constant, and the time during each cycle that SW1 is in the SERIES position is altered, also referred to as constant off-time operation. However, it should be noted that other modalities such as, for example, constant on-time or constant cycle frequency operation may also be employed. Modalities are also contemplated where any or all of on-time, off-time, and frequency vary in such a way so as to maintain the desired ratio of on-time to off-time while meeting other design goals such as restricted ripple voltage and ripple current variation.

According to a particular class of embodiments, the control algorithm governing operation of the control block periodically searches from a high SERIES position time downward until a power maximum is found. This maximum corresponds to the maximum power point of a PV substring which may itself contain bypass diodes. In the alternative, searches may be conducted from a minimum duty cycle to a maximum duty cycle. However, the disadvantage of search from a minimum duty cycle is that local maximum power points may be encountered which are less than the global maximum power point.

It should be noted that the control block depicted in FIGS. 10-12 may be implemented using a microcontroller, digital signal processor, or other programmable machine of the like, the operation of which is governed by code that may be stored in physical memory or any suitable storage medium (not shown) associated with the microcontroller, as software or firmware, as understood by those of skill in the art. However, it should be noted that the use of a microcontroller or similar device is not necessary to implement the invention. That is, the functionality described herein may readily be implemented using alternative technologies without departing from the scope of the invention. For example, embodiments are contemplated which implement such functionalities using programmable or application specific logic devices, e.g., PLDs, FPGAs, ASICs, etc. Alternatively, analog circuits and components may be employed. These and other variations, as well as various combinations thereof, are within the knowledge of those of skill in the art, and are therefore within the scope of the present invention.

Where the attached substring includes multiple substrings each bypassed by a two terminal diode, and where output of each substring varies, the maximum power point occurs at a load current either just below the current at which any bypass diode conducts, or at a substantially higher current closer to the substring short-circuit current value.

According to a specific class of implementations, the operating frequency of SW1 is in the range of 100 kHz to 2 MHz which represents compromises among component size, cost, and power efficiency. The resulting energy storage requirements, and time constants of both the input and output filters are in the range of 2 us-15 us. The search for the maximum power operating point takes place very quickly, and can be settled typically within 50 ms. The perturbations in output power are therefore well above the bandwidth of power tracking algorithms in AC inverters typically of 0.1-5 Hz. As a result, the control loops and connected AC inverters do not conflict.

An alternate control algorithm (applicable when an embodiment of the invention coexists with a centralized inverter that executes maximum power point tracking for the entire string) maximizes the product of PV substring current (ISUB) and VIN_FILT by inference from measurement of the voltage between STRING+ and STRING−. In this embodiment, the system relies upon the central inverter to establish a string current that reflects maximum power output for all substrings combined. The central inverter alters string current at a low rate typically of 0.1 to 5 Hz. The control algorithm of this embodiment maximizes the voltage across from STRING+ to STRING− by altering the ratio of SW1 on-time to off-time. For any current through the STRING− to STRING+ terminals, maximum voltage across the STRING+ to STRING− terminals corresponds to maximum power delivery from the attached PV substring.

The voltage at SW1 commonly alternates between VIN_FILT and a negative value equal to the I*R drop of the SW1 bypass path. The output filter including L2 and C3 averages these values to a steady voltage under load.

Whereas the object of a conventional Buck regulator is to regulate either the voltage or current at the output node, the present invention regulates power at the output node of the input filter, i.e., at the VIN_FILT node, to generate the maximum obtainable from the local PV substring at any given time. String current is maintained independently of substring current during diode bypass intervals as the sum of filtered substring current passing through L1, and current from C2.

Another distinction between specific embodiments of the invention and conventional Buck regulator topologies is the inclusion of an additional capacitor and an inductor in the input filter, e.g., C1 and L1 of FIGS. 10-12. A conventional Buck regulator typically includes only a single capacitor which sees substantial voltage and current ripple. However, the maximum power point of a solar panel is highly dependent on the output current. Therefore, it is important to ensure that variations in current are minimized. Thus, the additional capacitor and inductor are included to reduce the magnitude of the current ripple that would otherwise be reflected back to the panel and reduce the panel's efficiency.

It should be noted that embodiments of the invention are contemplated in which this additional C-L is not included. However, such embodiments are not preferred in that they would require an undesirably large capacitor (probably a wet, electrolytic capacitor) to reduce current ripple. Such capacitors are undesirable because they introduce reliability problems when exposed to the elements over time. Thus, the additional C-L in specific embodiments enables a design in which the size of these components is reduced sufficiently to employ high reliability components, e.g., plastic or ceramic capacitors.

According to various embodiments, the operating current through the output node is established by an external load such as, for example, a DC-AC inverter. Embodiments of the present invention have no particular concern for the exact voltage or current at the output node. The output voltage of any given embodiment of the invention in a PV string may vary with the local PV substring output and the string current which is set by the highest output substring of the entire string in concert with the string load.

Figure 13:
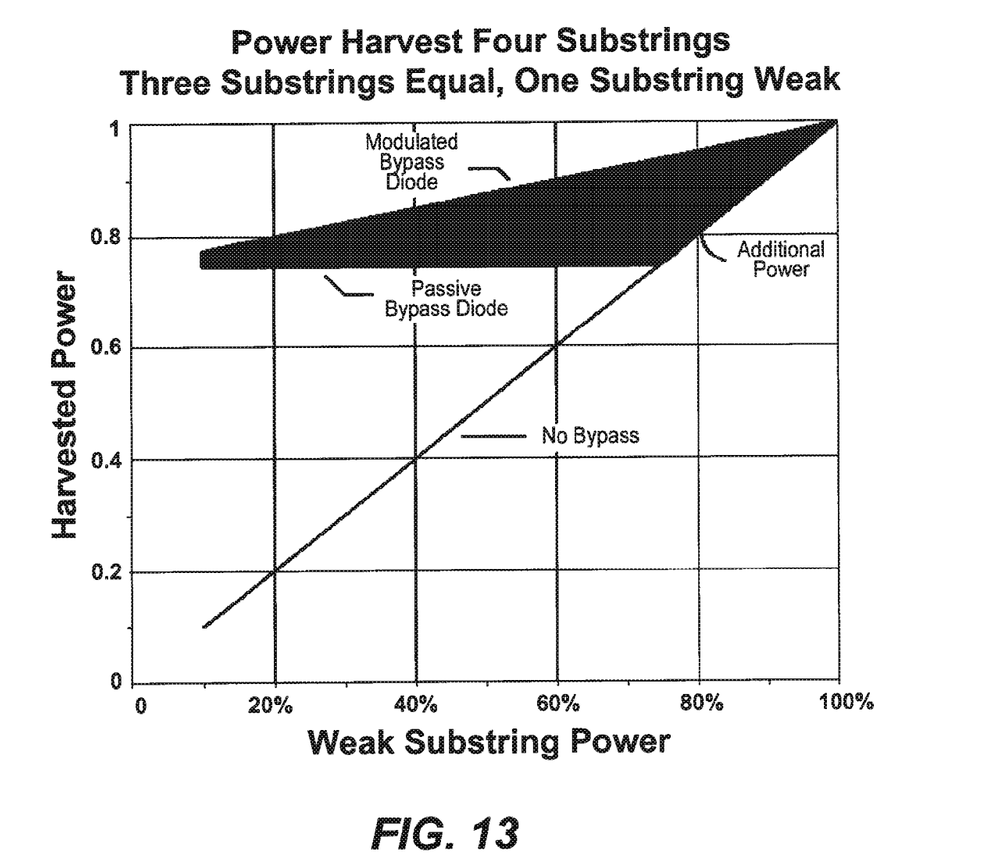
FIG. 13 illustrates the improvement in power harvest for a four substring PV string having one weak substring using a design implemented in accordance with a specific embodiment of the invention.

FIG. 13 illustrates the improvement represented by using a modulated bypass diode in accordance with an embodiment of the invention in comparison to two conventional approaches, i.e., using a passive bypass diode, and using no bypass diode. The figure illustrates a comparison of the harvested power for each of the three configurations in the case of a PV string having four substrings, three of which produce at a reference power level, and one of which, i.e., the weak substring, produces at a fraction of that reference. As shown for the case without a bypass diode, the network power limits identically with the output of the low output substring. In the case of the passive bypass diode, the maximum output power approximates (N−1)/N for any power level from the low output substring of 75% or less. Finally, the maximum output power using the modulated bypass diode approximates the summed power of each substring.

It should be noted that FIG. 13 is a simplified representation that does not account for the power consumption of the modulated bypass diode. That is, implementations according to the invention do consume a certain amount of power and therefore limit best case efficiency. However, embodiments of the invention may be implemented to mitigate the impact on efficiency. For example, embodiments are contemplated in which the high end switching frequency may be reduced to limit switching losses. Such an approach may be considered unusual in that under normal conditions the switching frequency is typically much higher than the cut-off frequency of the input and output filters.

According to a specific embodiment, the switching frequency may be reduced well below the cut-off frequency. This approach still produces low ripple as it is only used when the duty cycle is very high. That is, rectangle waves have two primary frequency components: that of the high duty cycle portion, and that of the low duty cycle portion. These frequencies are the same for a 50% duty cycle. However, as the duty cycle drives towards either extreme of 0% or 100%, the frequency components separate to where the longer portion approximates $F/(2*DC\_long)$ and the shorter portion $F/(2*DC\_short)$. If $F/(2*DC\_short)$ is retained well above the filter cut-off, the filters still smooth out the waveform. The reason for moving $F/(2*DC\_long)$ well below the filter cut-off is to prevent undesirable high amplitude ringing that occurs for any excitation near the filter cut-off. So by shifting the frequency down and using a very high DC_long, e.g., >99.7%, and a very short DC_short, e.g., <0.3%, high efficiency from reduced switching losses can be achieved while still using a small filter and achieving low ripple.

In addition, for installations with a large number of substrings, small mismatches of the strings favors implementations in accordance with the invention. For example, if a set of panels has a matching variation of ±3%, then as a population the total theoretical power for N panels of W power rating would statistically average to simply N*W. The harvestable power in the non-diode case would be limited to the power output of the weakest substring, i.e., −3%. Therefore, on average, any array constructed with panels having a mean power variation of ±K/W (0<K<<1), the power output will always trend to (1−K)*W. This power loss from mismatch typically makes up for most if not all of the power consumption of the modulated bypass diodes implemented in accordance with the invention.

Figure 14:
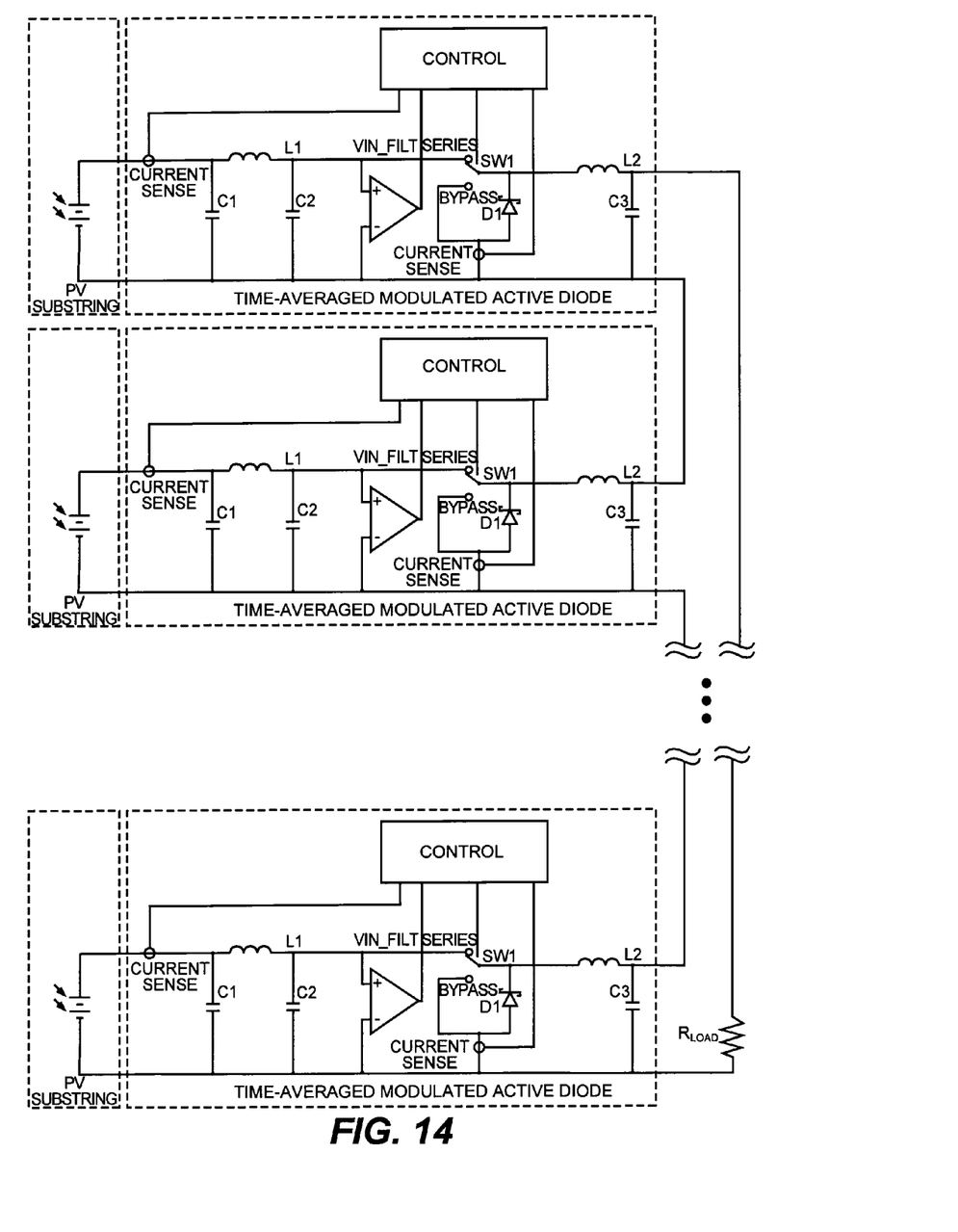
FIG. 14 is a representation of a PV string using DC-DC converters implemented in accordance with a specific embodiment of the invention.

Because embodiments of the present invention replace bypass diode functionality, PV strings implemented in accordance with embodiments the invention wire in series as illustrated in FIG. 14. As will be understood with reference to the figure, DC-DC converters implemented in accordance with such embodiments may be provided in a stand alone package or integrated with the panel, string, or substring with which they are associated. A stand alone module can be inserted in the series chain, with the associated panel or string being instead connected to the two inputs of the stand alone module.

It should also be noted that, in contrast with other solutions, DC-DC converters designed in accordance with embodiments of the invention can be applied selectively, i.e., only to some panels or strings in an installation. This represents a significant cost advantage relative to architectures that require power conversion on each connected panel, string, or substring. For example, solutions which employ a boost architecture must be applied to every panel. Selective installation may be particularly advantageous, for example, to selectively maximize the output from particular panels such as, for example, panels that do not receive optimal sunlight due to placement, orientation, shading, etc. DC-DC converters designed in accordance with embodiments of the invention may also be applied to multiple panels, e.g., two or more panels connected in series. More generally, DC-DC converters designed in accordance with the invention may be employed in conjunction with virtually any level of PV module including, for example, one or more cells, one or more substrings, one or more strings comprising multiple substrings, one or more panels, etc. As will be understood, this flexibility provides a significant advantage over conventional solutions.

Various embodiments of the present invention may be characterized by a number of advantages relative to previous solutions. For example, because embodiments of the present invention wire substrings in series, such embodiments are compatible with existing PV wiring structures, and may therefore be readily incorporated into such installations. In addition, because embodiments of the present invention wire substrings in series, they do not suffer the wiring losses of parallel bus architectures. Nor do they require reverse bias diode protection required in a parallel bus topology.

Neither do embodiments of the present invention suffer the forward diode voltage drop of voltage booster topologies that lack synchronous rectifiers. Embodiments of the present invention also do not have the large energy storage requirements of single or split phase DC-AC inverter topologies. Capacitors may be economically implemented using highly reliable plastic and/or ceramic capacitor technologies.

Embodiments of the present invention do not connect directly to AC utility and do not have any need for anti-islanding function to protect utility service personnel.

For some embodiments of the invention, a short-circuit failure of any single component will not result in catastrophic failure of string power. For some embodiments of the invention, an open-circuit failure of most components will not result in catastrophic failure of string power. And for those components which have the potential to result in failure of string failure, the architecture is such that such components may be economically realized in such a way as to reduce open failure probabilities to extremely low values.

While the invention has been particularly shown and described with reference to specific embodiments thereof, it will be understood by those skilled in the art that changes in the form and details of the disclosed embodiments may be made without departing from the spirit or scope of the invention. In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A photovoltaic (PV) system, comprising a plurality of PV modules connected in series, selected ones of the PV modules having an associated energy storage circuit in parallel therewith, and a switched bypass current path in parallel with the associated energy storage circuit, the PV system further comprising control circuitry associated with each selected PV module programmed to control the switched bypass current path associated with each selected PV module independent of the control circuitry associated with any other selected PV module with reference to a local PV module current through the associated selected PV module, an aggregate system current through the switched bypass current path, and a local PV module voltage across the energy storage circuit, such that an averaged product of the local PV module current and the local PV module voltage for each selected PV module is maximized.

2. The PV system of claim 1 wherein each selected PV module comprises one of the group consisting of at least one PV cell, at least one PV substring, at least one PV string, or at least one PV panel.

3. The PV system of claim 1 wherein the energy storage circuit comprises two capacitors and an inductor in a pi configuration.

4. The PV system of claim 1 wherein the selected PV modules comprise all of the plurality of PV modules in the control circuitry comprises one controller for the PV system.

5. The PV system of claim 1 wherein the control circuitry comprises one controller for each of the selected PV modules comprise fewer than all of the plurality of PV modules in the PV system.

6. The PV system of claim 1 wherein the energy storage circuit, the switched bypass current path, and the control circuitry associated with each selected PV module is integrated with the associated selected PV module.

7. The PV system of claim 1 wherein the energy storage circuit, the switched bypass current path, and the control circuitry associated with each selected PV module is included in a DC-DC converter module separate from the associated selected PV module.

8. The PV system of claim 1 wherein the energy storage circuit associated with each selected PV module is characterized by a cut-off frequency, and wherein the control circuitry associated with each selected PV module is configured to control the switched bypass current path at a switching frequency that is well below the cut-off frequency.

9. The PV system of claim 8 wherein each selected PV module is configured to control the switched bypass current path with a duty cycle greater than about 99.7%.

10. The PV system of claim 1 wherein the energy storage circuit associated with each selected PV module is characterized by a cut-off frequency, and wherein the control circuitry associated with each selected PV module is configured to control the switched bypass current path at a switching frequency that is much higher than the cut-off frequency.

11. A DC-DC converter for use with a photovoltaic (PV) module, the DC-DC converter comprising an energy storage circuit configured for connection in parallel with the PV module, and a switched bypass current path in parallel with the energy storage circuit, the DC-DC converter further comprising control circuitry programmed to control the switched bypass current path independent of external control circuitry associated with another PV module in a PV system of which the PV module is a part with reference to a PV module current through the PV module, an aggregate system current through the switched bypass current path, and a PV module voltage across the energy storage circuit, such that an averaged product of the PV module current and the PV module voltage is maximized.

12. The DC-DC converter of claim 11 wherein the energy storage circuit comprises two capacitors and an inductor in a pi configuration.

13. The DC-DC converter of claim 11 wherein the PV module for which the DC-DC converter is configured comprises one of the group consisting of at least one PV cell, at least one PV substring, at least one PV string, or at least one PV panel.

14. The DC-DC converter of claim 11 wherein the control circuitry is configured to control the switched bypass current path for one of constant off-time operation, constant on-time operation, constant cycle frequency operation, variable frequency operation, or variable on-time operation.

15. The DC-DC converter of claim 11 wherein the energy storage circuit is characterized by a cut-off frequency, and wherein the DC-DC converter is configured to operate at a switching frequency that is well below the cut-off frequency.

16. The DC-DC converter of claim 15 wherein the DC-DC converter is configured to operate with a duty cycle greater than about 99.7%.

17. The DC-DC converter of claim 11 wherein the energy storage circuit is characterized by a cut-off frequency, and wherein the DC-DC converter is configured to operate at a switching frequency that is much higher than the cut-off frequency.

18. A DC-DC converter for use with a photovoltaic (PV) module, the DC-DC converter having a Buck regulator topology including an energy storage circuit and a switch, the DC-DC converter further comprising control circuitry programmed to control the switch independent of external control circuitry associated with another PV module in a PV system of which the PV module is a part and with reference to an aggregate system current such that an average power delivered by the PV module to an output node of the energy storage circuit is maximized.

19. The DC-DC converter of claim 18 wherein the energy storage circuit comprises two capacitors and an inductor in a pi configuration.

20. The DC-DC converter of claim 18 wherein the PV module for which the DC-DC converter is configured comprises one of the group consisting of at least one PV cell, at least one PV substring, at least one PV string, or at least one PV panel.

21. The DC-DC converter of claim 18 wherein the control circuitry is configured to control the switch for one of constant off-time operation, constant on-time operation, constant cycle frequency operation, variable frequency operation, or variable on-time operation.

22. The DC-DC converter of claim 18 wherein the energy storage circuit is characterized by a cut-off frequency, and wherein the DC-DC converter is configured to operate at a switching frequency that is well below the cut-off frequency.

23. The DC-DC converter of claim 22 wherein the DC-DC converter is configured to operate with a duty cycle greater than about 99.7%.

24. The DC-DC converter of claim 18 wherein the energy storage circuit is characterized by a cut-off frequency, and wherein the DC-DC converter is configured to operate at a switching frequency that is much higher than the cut-off frequency.

* * * * *